United States Patent
Lowrey

(10) Patent No.: US 6,570,784 B2
(45) Date of Patent: May 27, 2003

(54) PROGRAMMING A PHASE-CHANGE MATERIAL MEMORY

(75) Inventor: Tyler A. Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 09/895,135

(22) Filed: Jun. 29, 2001

(65) Prior Publication Data

US 2003/0002332 A1 Jan. 2, 2003

(51) Int. Cl.$^7$ ................................................ G11C 11/00
(52) U.S. Cl. ........................ 365/163; 365/148; 365/191
(58) Field of Search ................................ 365/163, 148, 365/191

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 5,296,716 A | 3/1994 | Ovshinsky et al. | |
| 5,687,112 A * | 11/1997 | Ovshinsky | 257/3 |
| 5,789,758 A | 8/1998 | Reinberg | |
| 5,879,955 A | 3/1999 | Gonzalez et al. | |
| 5,912,839 A * | 6/1999 | Ovshinsky et al. | 365/163 |
| 5,920,788 A | 7/1999 | Reinberg | |
| 5,933,365 A | 8/1999 | Klersy et al. | |
| 5,970,336 A | 10/1999 | Wolstenholme et al. | |
| 5,998,244 A | 12/1999 | Wolstenholme et al. | |
| 6,002,140 A | 12/1999 | Gonzalez et al. | |
| 6,031,287 A | 2/2000 | Harshfield | |
| 6,075,719 A * | 6/2000 | Lowrey et al. | 365/148 |
| 6,085,341 A | 7/2000 | Greason et al. | |
| 6,087,674 A | 7/2000 | Ovshinsky et al. | |
| 6,141,241 A | 10/2000 | Ovshinsky et al. | |
| 6,153,890 A | 11/2000 | Wolstenholme et al. | |
| 6,229,157 B1 | 5/2001 | Sandhu | |
| 6,314,014 B1 * | 11/2001 | Lowrey et al. | 365/100 |

* cited by examiner

Primary Examiner—Richard Elms
Assistant Examiner—Toan Le
(74) Attorney, Agent, or Firm—Trop, Pruner & Hu, P.C.

(57) ABSTRACT

The memory device has constituent cells which include a structural phase-change material to store the cells data. This material may be, for instance, a chalcogenide alloy. A first pulse is applied to the cell to leave the material in a first state, such as a reset state in which the material is relatively amorphous and has relatively high resistivity. Thereafter, a second pulse is applied to the cell to change the material from the first state to a second, different state, such as a set state in which the material is relatively crystalline and has relatively low resistivity. This second pulse has a generally triangular shape, rather than a rectangular one.

60 Claims, 7 Drawing Sheets

PROGRAMMING A PHASE-CHANGE MATERIAL MEMORY

BACKGROUND

This invention is related to techniques for programming a structural phase-change material solid state memory device such as those that use a chalcogenide material which can be programmed into different resistivity states to store data.

Solid state memory devices that use a structural phase-change material as the data storage mechanism (referred to here simply as 'phase-change memories') offer significant advantages in both cost and performance over conventional charge storage based memories. The phase-change memory is made of an array of constituent cells where each cell has some structural phase-change material to store the cell's data. This material may be, for instance, a chalcogenide alloy that exhibits a reversible structural phase change from amorphous to crystalline. A small volume of the chalcogenide alloy is integrated into a circuit that allows the cell to act as a fast switching programmable resistor. This programmable resistor can exhibit greater than 40 times dynamic range of resistivity between the crystalline state (low resistivity) and the amorphous state (high resistivity), and is also capable of exhibiting multiple, intermediate states that allow multi-bit storage in each cell. The data stored in the cell is read by measuring the cell's resistance. The chalcogenide alloy cell is also non-volatile.

A conventional technique for programming a phase-change memory cell is to apply a rectangular pulse of current (having a constant magnitude) to the cell, at a voltage greater than a switching threshold for the phase-change material, which leaves the material in the reset state (amorphous and high resistivity). This may be followed by the application of a subsequent rectangular pulse, also at a voltage greater than the switching threshold, which changes the material to a set state (crystalline and low resistivity). The reset pulse has a higher magnitude of current than the set pulse so that the temperature of the phase change material is raised to $T_m$, the amorphizing temperature, before the material is rapidly cooled down and is left in the amorphous state. To change into the crystalline state, the material can be heated back up to an optimum temperature $T_{opt}$, which is lower than $T_m$. The temperature $T_{opt}$ is that which allows the material in the cell to be crystallized in a relatively short time interval and yielding a relatively low resistance. Ideally, this could be accomplished by having the magnitude of the set pulse be smaller than that of the reset pulse to prevent the phase-change material from reaching the amorphizing temperature, but large enough to cause the material to reach $T_{opt}$.

Because of fabrication process and material variations in phase change memories, the actual temperature of the phase-change material in the cells of a manufactured device varies significantly from cell to cell, for a given programming current/voltage level obtained by a set pulse. This variation can cause the material in one or more cells of a device to inadvertently reach $T_m$ during application of the conventional rectangular set pulse, and thereby cause those cells to erroneously remain in the reset state rather than change to the set state. To avoid this problem, conventional programming techniques use a rectangular set pulse (applied to every cell in the device) that has a reduced magnitude, as shown in FIG. 1. The magnitude of the set current is sufficiently low, in view of the expected variation in cell temperature at that magnitude, to guarantee that no cell in the device reaches Tm while the set pulse is applied to it. This solution, however, may slow down the programming of the memory device, since a longer rectangular set pulse is needed due to the less than optimal temperatures being generated by the lower magnitude of the set pulse. In addition, many cells in the memory are subjected to significantly less than the optimum crystallization temperature which reduces the dynamic range in resistivity between the set and reset states in those cells.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, the set pulse for programming a phase-change memory is shaped to be generally triangular, rather than rectangular. Such a pulse is also referred to here as a 'set sweep'. With the set sweep, the magnitude of the set pulse current can be increased, so that the phase-change material in all cells of a device can reach temperatures of at least $T_{opt}$ during the set pulse yet still change to the set state, due to the downward slope in the trailing portion of the pulse. Better crystallization takes place in the memory, despite fabrication process and material variations. With better crystallization, the resistivity differences between the set and reset states are more pronounced. This means that the tolerance for variations in the memory has increased, therefore lowering manufacturing costs by allowing greater yields from the fabrication and testing flows.

Although the memory device may reach temperatures as high as $T_m$ when the magnitude of the triangular set pulse is greater than the conventional set current magnitude, the triangular shaped pulse has a decaying or downward sloping trailing portion such that even those cells that reach $T_m$ will have a chance to cool down to and crystallize at or near $T_{opt}$. The decay during the trailing portion is slow enough to ensure that those cells spend the minimum required time interval at approximately $T_{opt}$, to yield better crystallization even in those cells. For devices that are expected to have large variations across their cell populations, the time of the current transition from its maximum value to its minimum value for the slope of the trailing portion may need to be longer than for devices that are expected to show relatively small variations.

Figure 1:
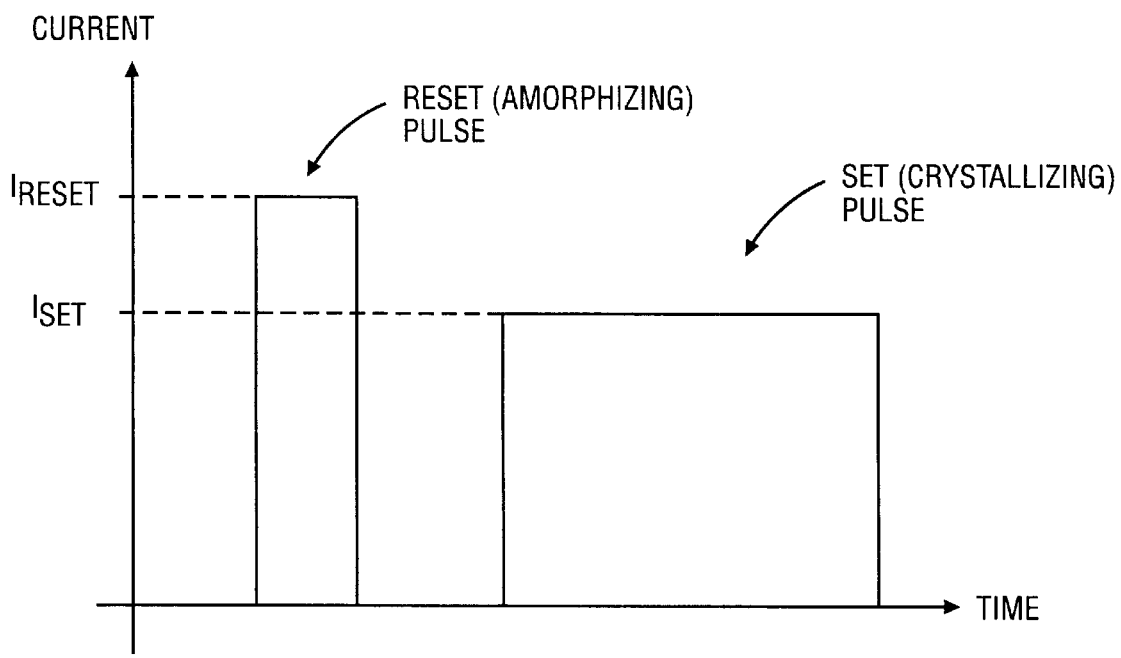
FIG. 1 shows a conventional sequence of pulses for programming a phase-change memory.
Figure 2:
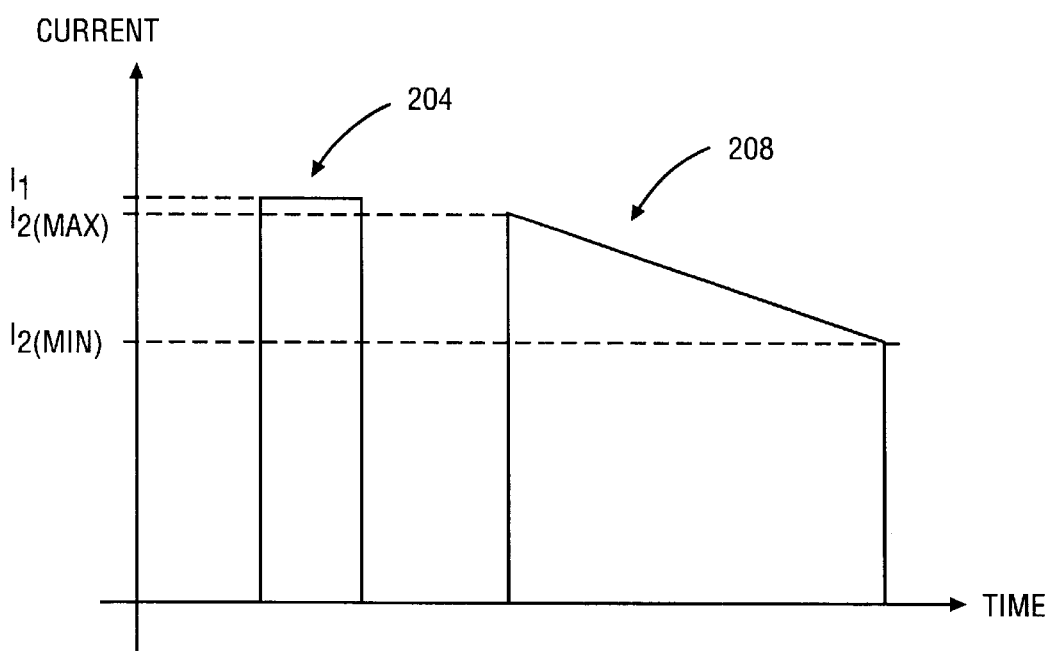
FIG. 2 illustrates a sequence of phase-change memory programming pulses including a set sweep, according to an embodiment of the invention.

FIG. 2 illustrates a sequence of phase-change memory programming pulses, according to an embodiment of the invention. A first pulse 204 is applied to a constituent cell of a phase-change memory. This pulse may be of any conventional type. A typical shape is rectangular as shown, with a constant, current magnitude. Rectangular pulses are relatively easy to generate, using only a single switching transistor (not shown). The first pulse 204 may, as mentioned above in the background, be a reset or amorphizing pulse having a magnitude $I_{reset}$ that is sufficiently high such that the phase-change material in the cell reaches $T_m$, the amorphizing temperature of the material. Alternatively, the current magnitude may be different so long as the first pulse 204 leaves the cell in a predefined state. The pulse width of the first pulse 204 is also selected to be long enough to achieve the predefined state.

Application of the first pulse 204 is followed by a second pulse 208 which is generally triangular in shape, as shown. The second pulse 208 has a leading portion that peaks at the magnitude or maximum, $I_{2(max)}$, and a trailing portion that decays to a minimum value $I_{2(min)}$. The leading portion may have a much greater slope than the trailing portion. The shape of the second pulse 208 can be selected, in view of fabrication process and material variations across the phase-change materials and the circuitry in the constituent cells of the memory device, such that every cell of the memory device changes from the first state to a second, different state if the second pulse 208 were applied to each of them. The first and second states may be the reset and set states mentioned above in the background. The shaping of the second pulse 208 involves setting a number of parameters that include the maximum and minimum values, and the decay rate/pulse width, in view of the structure and type of phase-change material used, as well as the operating thermal environment of the memory device.

Figure 3:
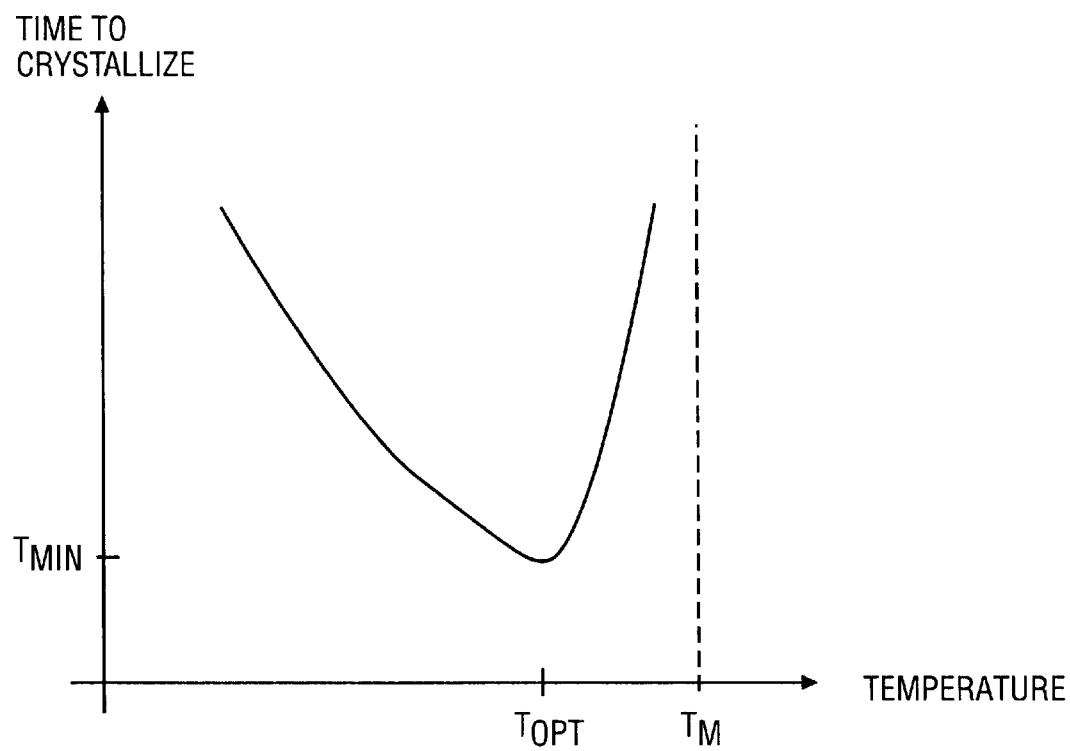
FIG. 3 illustrates a plot of crystallization time in a phase-change material memory cell as a function of the temperature of the phase-change material.

The levels of $I_{2(max)}$ and $I_{2(min)}$ may assume a wide range of values. For instance, $I_{2(max)}$ may be substantially greater than $I_{reset}$, or it may be substantially smaller so long as the pulse width is long enough to insure that the phase-change materials in the cells to which the pulse is to be applied crystallize. Crystallization is a function of both the temperature and the amount of time the material spends at that temperature. This may be explained by FIG. 3 which illustrates an exemplary plot of crystallization time (in a phase-change material memory cell) as a function of the temperature of the phase-change material. The plot shows that at temperatures below $T_{opt}$, the material needs a longer time interval to crystallize. Hence, at lower current magnitudes (which translates roughly to lower temperatures being generated in the phase-change material), longer pulse widths are needed to set the phase-change memory cell. Ideally, a set pulse should have a current magnitude that yields $T_{opt}$, for as many cells as possible in a memory device, so as to provide the shortest set programming interval, $T_{min}$, as well the lowest set state resistance for those cells.

The level of $I_{2(min)}$ may also vary over a wide range of values, including as low as zero. Ideally, an upper bound on $I_{2(min)}$ for a set pulse may be one which insures that the temperature of the phase-change material in all cells to which the pulse will be applied is below $T_m$ at the end of the pulse (when $I_{2(min)}$ has been reached).

Figure 4:
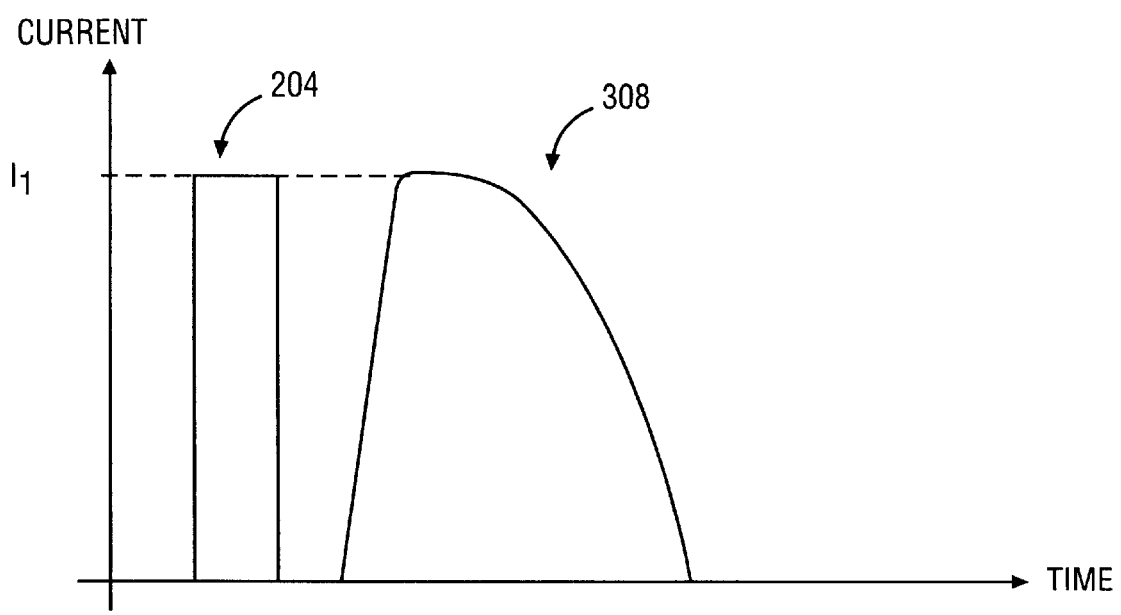
FIG. 4 depicts another sequence of phase-change memory programming pulses, including a set sweep.

FIG. 4 depicts another sequence of phase-change memory programming pulses. Note how the second pulse (set sweep) 308 in this example, although still referred to as generally triangular, has a relatively short intermediate portion between the leading and trailing portions, wherein the intermediate portion has essentially zero slope relative to the leading and trailing portions. Also, in contrast to the linear decay rate of FIG. 2, the trailing portion in FIG. 4 has a nonlinear slope. In general, the decay rate in the trailing portion may be of a wide range, including polynomial, logarithmic, and exponential, so long as the trailing portions cause all relevant cells in the device to sweep through a rapid crystallization temperature interval.

Figure 5:
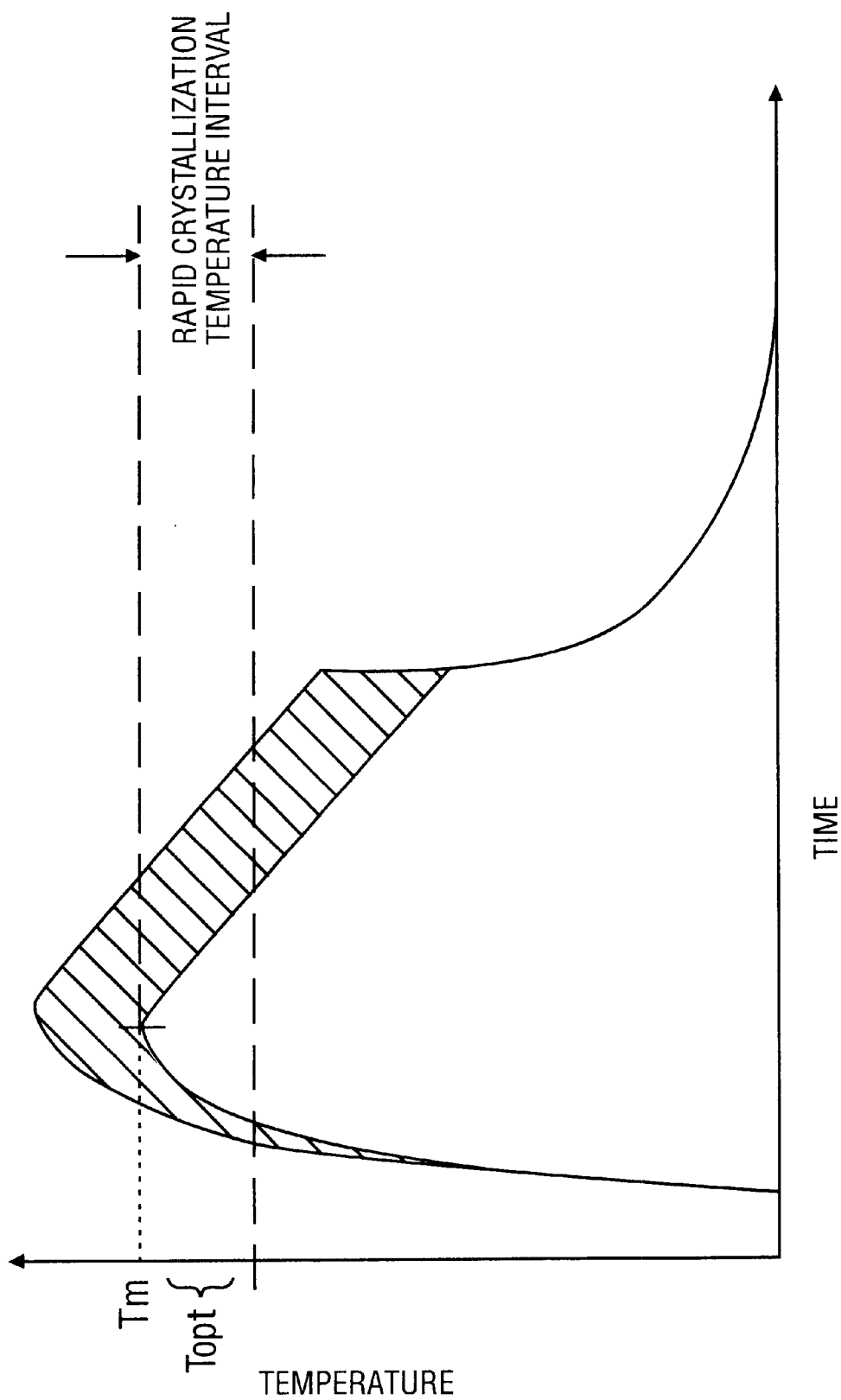
FIG. 5 shows the variation in the temperature of phase-change material in a memory cell versus time, while a set sweep according to an embodiment of the invention is being applied to the cell.
Figure 6:
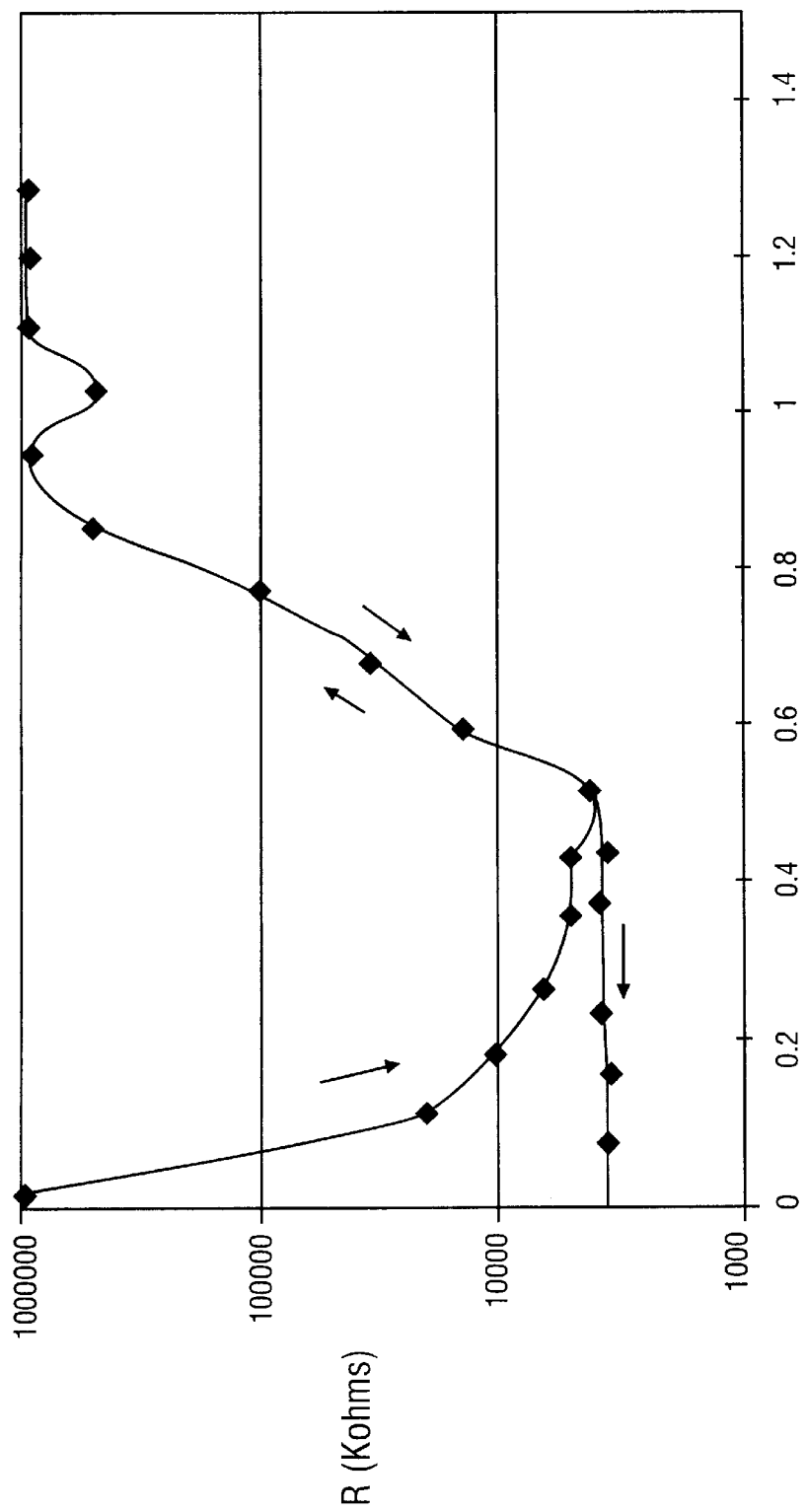
FIG. 6 illustrates a plot of memory cell resistance versus programming current level, for a particular phase-change memory device.

The effect of the triangular set pulse on cell temperatures in a phase-change memory are illustrated in the exemplary plot of FIG. 5. It can be seen that even with large variation in temperature (depicted by the shaded band) for a given magnitude and decay rate in the triangular set pulse, the entire memory device is swept through a rapid crystallization temperature interval, so that optimum, i.e. lowest, set resistance is obtained for all cells in the device. This is also illustrated in FIG. 6 which is a plot of memory cell resistance versus set current for a particular phase-change memory device. The resistance is plotted as the memory cell, beginning in the reset state, responds to the various levels of programming current. The sequence for applying the various levels of programming current is indicated by the arrows, starting from the left and then moving to the right and then coming back to the left. As can be seen, the lowest set resistance may be obtained at a value of set current just prior to its rapid rise towards the reset level. Advantageously, the triangular nature of the set pulse allows this lowest set resistance to be 'locked in' as the set sweep pulse sweeps back down from its peak value. Assuring the lowest set resistance for each cell in the memory device provides superior margin for memory read operations, higher manufacturing yields, as well as better product reliability.

Figure 7:
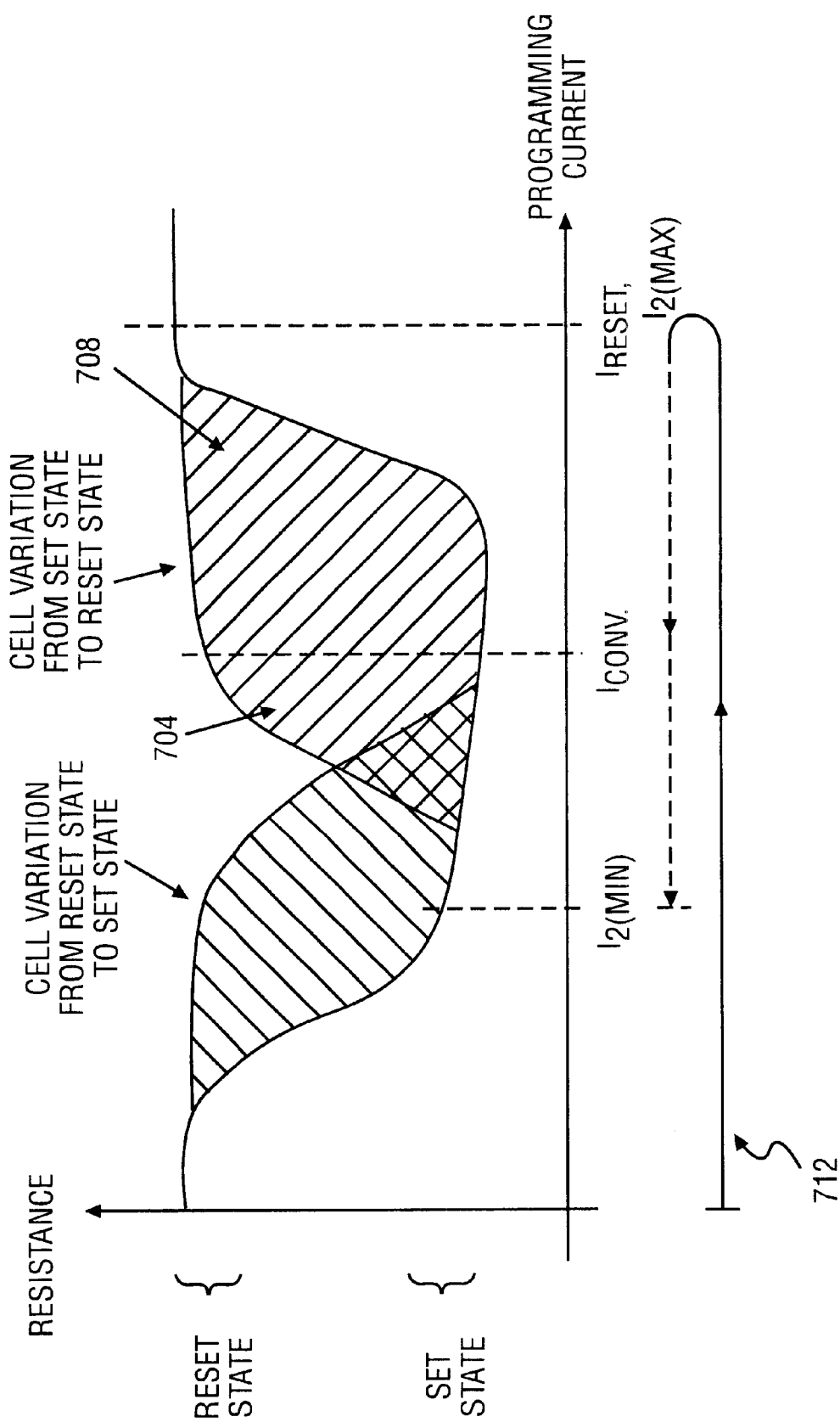
FIG. 7 depicts a plot of memory cell resistance versus programming current for a large population of memory cells, showing an example of a relatively wide variation in the population.

The advantages of the set sweep can also be appreciated by considering FIG. 7 which depicts a plot of memory cell resistance versus programming current for a large population of memory cells in a memory device. This device suffers from a relatively wide variation in the population of its constituent memory cells. To take all of the cells from the set state to the reset state, the application (to each cell) of the conventional rectangular pulse of magnitude $I_{reset}$ will work. However, the conventional programming technique of applying the same rectangular set pulse (with a constant magnitude) would be unable to return every cell in the device to the set state. That's because to do so the current magnitude needs to be at least as high as $I_{conv}$. But at that magnitude some of the cells, namely those falling within region 704, will stay at the reset state when the pulse has abruptly ended. In contrast, this does not occur with the set sweep if $I_{2(min)}$ is selected to be as shown, since all cells, including those in region 704 as well as those in region 708, will be swept through their crystallization temperature intervals (and therefore assured of returning to the set state) by the time the pulse has slowly decayed to $I_{2(min)}$. The set sweep is indicated by a loop 712 whose trailing portion is shown in dotted lines.

Figure 8:
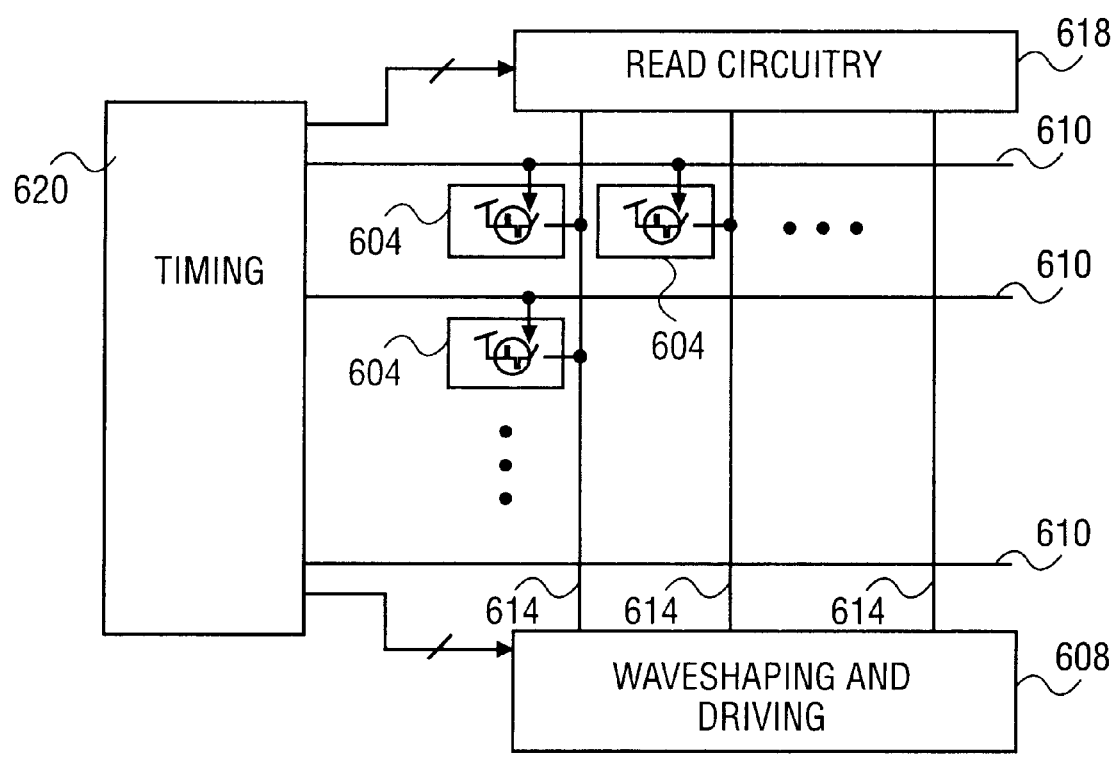
FIG. 8 illustrates a block diagram of a phase-change material memory device, including waveshaping and driving circuitry that are designed to provide the voltage and current levels needed to program the constituent cells of the device.

Turning now to FIG. 8, what is shown is a block diagram of a phase-change material memory device, including waveshaping and driving circuitry that are designed to provide the voltage and current levels needed to program the constituent cells of the device. The device features an array of memory cells 604 where each cell 604 can be accessed by a unique pair of vertical conductors 614 and horizontal conductors 610. In this embodiment, the horizontal conductors 610 allow a control signal from timing logic 620 to be provided to each cell 604 to close or open a solid state switch therein. This solid state switch is in series with a volume of the phase-change material whose other terminal is connected to a power supply or power return node. Current is thus sourced or sunk through the phase-change material when the switch is closed. This programming current is provided through the vertical conductors 614. The sourcing or sinking of the programming current is performed by either the read circuitry 618 or waveshaping and driving circuitry 608, depending upon whether a write or read operation is being performed. The read circuitry 618 may be entirely conventional.

The waveshaping and driving circuitry 608 will be designed so as to provide the voltage and current levels that are needed to program the cells 604 according to the first and second pulses described above, wherein the second pulse has a generally triangular shape. The waveshaping circuitry can be implemented using conventional analog waveshaping circuits such as integrator/ramp circuits, exponential and logarithmic circuits, as well as others. The shaped pulses are then driven by conventional fanout circuitry so that each cell 604 that is connected to a vertical conductor 614 is assured of receiving the desired levels of current and voltage to achieve the set sweep.

The timing associated with the generation of the pulses may be determined by timing logic 620. Timing logic 620 provides digital control signals to the waveshaping and driving circuitry 608 and the read circuitry 618 so that the latter circuits either measure the resistance of the memory cell 604 (read operation) or provide the reset and set pulses at the correct timing and to the selected memory cell 604. Accesses to the cell 604 may be in random fashion where each cell can be accessed individually, or it may be orchestrated according to a row by row basis, depending upon the higher level requirements of the memory system.

The memory device depicted in FIG. 8 may be built using a wide range of different fabrication processes, including a slightly modified version of a conventional complimentary metal oxide semiconductor (CMOS) logic fabrication process. The array of cells 604 and the waveshaping and driving circuitry 608 may be formed in the same integrated circuit (IC) die if doing so can take advantage of the lower cost of system integration on a single chip.

Figure 9:
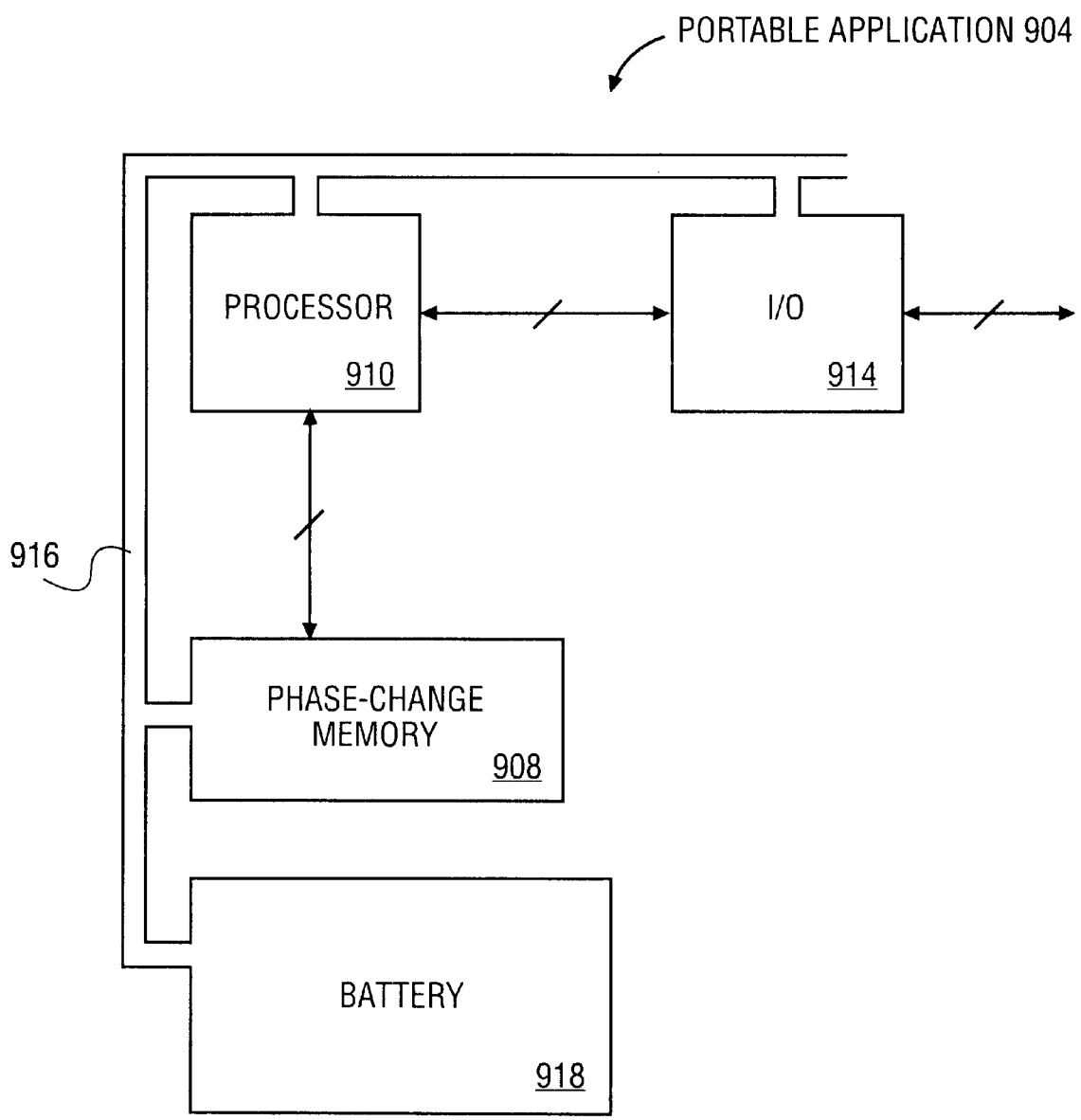
FIG. 9 depicts a block diagram of an embodiment of a portable application of a phase-change memory that incorporates the programming process.

FIG. 9 illustrates a block diagram of a portable application 904 of the phase-change memory programming process described above. A phase-change memory 908 is operated according to an embodiment of the programming process described above. The phase-change memory 908 may include one or more integrated circuit dies where each die has a memory array that is programmed according to the various embodiments of the programming techniques described above in FIGS. 1–8. These IC dies may be separate, stand alone memory devices that are arranged in modules such as conventional dynamic random access memory (DRAM) modules, or they may be integrated with other on-chip functionalities. In the latter embodiments, the phase-change memory 908 may be part of an I/O processor or a microcontroller.

The application 904 may be for instance a portable notebook computer, a digital still and/or video camera, a personal digital assistant, or a mobile (cellular) hand-held telephone unit. In all of these applications, an electronic system includes a processor 910 that uses the phase-change memory 908 as program memory to store code and data for its execution. Alternatively, the phase-change memory 908 may be used as a mass storage device for non-volatile storage of code and data. The portable application 904 communicates with other devices, such as a personal computer or a network of computers via an I/O interface 914. This I/O interface 914 may provide access to a computer peripheral bus, a high speed digital communication transmission line, or an antenna for unguided transmissions. Communications between the processor and the phase-change memory 908 and between the processor and the I/O interface 914 may be accomplished using conventional computer bus architectures.

The above-described components of the portable application 904 are powered by a battery 918 via a power supply bus 916. Since the application 904 is normally battery powered, its functional components including the phase-change memory 908 should be designed to provide the desired performance at low power consumption levels. In addition, due to the restricted size of portable applications, the various components shown in FIG. 9 including the phase-change memory 908 should provide a relatively high density of functionality. Of course, there are other non-portable applications for the phase-change memory 908 that are not shown. These include, for instance, large network servers or other computing devices which may benefit from a non-volatile memory device such as the phase-change memory.

As an example, the phase-change material may be Ge2Sb2Te5. An exemplary pulse may have a peak current magnitude of Ireset, where Ireset is sufficiently high to allow the cells of the array to be programmed into the reset state. The exemplary pulse may also have a falling edge that decreases from Ireset to zero current in about 200 nsec. These specifics, however, are merely exemplary and the programming technique may work with a wide range of different phase-change materials and pulse shapes having relatively slow falling edges.

To summarize, various embodiment of a phase-change material memory programming technique, referred to as a set sweep, have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, the phase-change material may be a chalcogenide alloy or other suitable structural phase-change material that acts as a programmable resistor. The specification and drawings are, accordingly, to be regarded in an illustrative rather than a restrictive sense.

What is claimed is:

1. A method comprising:
   applying a signal to a first memory material;
   applying a second signal to the first memory material; and
   selecting a decay rate of the signal so that a fall time of the signal is greater than a fall time of the second signal.

2. The method of claim 1 including altering a resistance of the first memory material.

3. The method of claim 2, wherein the decay rate is set to alter the resistance of the memory material from a first resistance to a second resistance that is lower than the first resistance.

4. The method of claim 1 including altering a state of the memory material.

5. The method of claim 4, wherein the state is altered from a first state to a second state and a resistance of the memory material in the first state is greater than the resistance of the memory material in the second state.

6. The method of claim 4, further comprising applying the signal to a second memory material having different programming characteristics than the first memory material and wherein setting the decay rate of the signal includes setting the decay rate so that the memory material and the second memory material are placed in a predefined state when the signal is applied to the first and second memory materials.

7. The method of claim 6, wherein the different programming characteristics include variations in resulting resistance of the first and second memory materials when a rectangular pulse having a predetermined amount of current is applied to the first and second memory materials, wherein the variations are due to fabrication process and material variations.

8. The method of claim 4, wherein a magnitude of the signal is sufficient to heat the memory material to an amorphizing temperature when the signal is applied to the memory material and wherein the decay rate is set so that after the memory material reaches the amorphizing temperature, the memory material cool downs at a sufficient rate so that the memory material is placed in a first state from a second state.

9. The method of claim 1, wherein the signal places the memory material in a first state when the signal is applied to the memory material and the second signal places the memory material in a second state when the second signal is applied to the memory material.

10. The method of claim 9, wherein the first state is a crystalline state and the second state is a amorphous state.

11. The method of claim 9, wherein a resistance of the memory material in the first state is less than the resistance of the memory material in the second state.

12. The method of claim 1, wherein the signal is a pulse having a leading portion and a trailing portion, wherein the leading portion occurs prior to the signal reaching a maximum level and the trailing portion occurs after the signal reaches the maximum level.

13. The method of claim 12, further comprising setting the decay rate of the signal by setting a slope of the trailing portion of the signal.

14. The method of claim 1, wherein the memory material is a phase-change material.

15. A method comprising:
applying a signal to a first memory material; and
setting a slope of a trailing portion of the signal to set a fall time of the signal to place the memory material in a selected state.

16. The method of claim 15, wherein the signal is a pulse having a leading portion and the trailing portion, wherein the leading portion occurs prior to the signal reaching a maximum level and the trailing portion occurs after the signal reaches the maximum level.

17. The method of claim 15, wherein setting the slope includes applying a slope that varies with time.

18. The method of claim 15, wherein the slope is set to increase with time.

19. The method of claim 15, wherein the slope is set to a nonlinear slope.

20. The method of claim 15, wherein setting the slope comprises shaping the trailing portion to change from a negative slope to a substantially vertical slope.

21. The method of claim 15, wherein setting the slope comprises shaping the signal so that the signal is nonrectangular.

22. The method of claim 15, further comprising applying a second signal to the memory material, wherein the slope of the trailing portion of the signal is set so that the slope of the trailing portion of the signal is different than a slope of a trailing portion of the second signal.

23. The method of claim 22, wherein the slope of the trailing portion of the second signal is substantially vertical and the slope of the trailing portion of the signal is negative.

24. The method of claim 15, wherein setting the fall time includes setting a decay rate of the signal.

25. The method of claim 15, wherein the memory material is a phase-change material.

26. The method of claim 15, further comprising applying a second signal to the memory material, wherein setting the fall time includes setting the fall time to be greater than a fall time of the second signal.

27. The method of claim 26, wherein a fall time of the second signal is substantially zero.

28. The method of claim 26, wherein the second signal places the memory material in a second state when the second signal is applied to the memory material.

29. The method of claim 28, wherein the selected state is a crystalline state and the second state is an amorphous state.

30. The method of claim 28, wherein a resistance of the memory material in the second state is greater than the resistance of the memory material in the selected state.

31. The method of claim 15, further comprising applying the signal to a second memory material having different programming characteristics than the first memory material and wherein setting a fall time of the signal includes setting a decay rate of the signal so that the memory material and the second memory material are placed in the selected state when the signal is applied to the first and second memory materials.

32. The method of claim 31, wherein the different programming characteristics include variations in resulting resistance of the first and second memory materials when a rectangular pulse having a predetermined amplitude is applied to the first and second memory materials, wherein the variations are due to fabrication process and material variations.

33. The method of claim 15, wherein a magnitude of the signal is sufficient to heat the memory material to an amorphizing temperature when the signal is applied to the memory material and wherein the fall time is set so that after the memory material reaches the amorphizing temperature, the memory material cool downs at a sufficient rate so that the memory material is placed in the selected state.

34. The method of claim 15, wherein the fall time is set to heat the memory material to a predetermined temperature to place the memory material in the selected state.

35. A system, comprising:
a processor;
an input/output (I/O) device coupled to the processor;
a memory comprising a phase change material and coupled to the processor; and
a circuit adapted to provide at least two signals to apply to the memory to change a state of the memory, wherein the circuit sets fall time of the first and second signals so that the fall time of the first signal is less than the fall time of the second signal.

36. The system of claim 35, wherein the circuit comprises a waveshaping circuit to set the fall time of the second signal by shaping a slope of a trailing portion of the second signal.

37. The system of claim 36, wherein the slope is shaped to vary with time.

38. The system of claim 35, wherein the circuit comprises a waveshaping circuit to set the fall time of the second signal by setting a decay rate of the second signal.

39. The system of claim 35, wherein the circuit comprises a waveshaping circuit to set the fall time of the second signal by shaping the second signal to have a triangular shape.

40. The system of claim 35, wherein the predefined state is a crystalline state.

41. The system of claim 35, wherein the fall times of the first and second signals are set so as to place the phase change material of the memory in a first state when the first signal is applied to the phase change material and place the phase change material in a second state when the second signal is applied to the phase change material.

42. The system of claim 41, wherein a resistance of the phase change material in the second state is lower than the resistance of the phase change material in the first state.

43. A method comprising:
   applying a first signal to a first memory material;
   applying the signal to a second memory material having different programming characteristics than the first memory material; and
   setting the decay rate of the signal by setting the decay rate so that the memory material and the second memory material are placed in a predefined state when the signal is applied to the first and second memory materials.

44. The method of claim 43 wherein the different programming characteristics include variations in resulting resistance of the first and second memory materials when a rectangular pulse having a predetermined amount of current is applied to the first and second memory materials.

45. A method comprising:
   applying a signal to a memory material;
   setting a decay rate of the signal to alter a characteristic of the memory material; and
   setting the magnitude of the signal at a level sufficient to heat the memory material to an amorphizing temperature when the signal is applied to the memory material and wherein the decay rate is set so that after the memory material reaches the amorphizing temperature, the memory material cools down at a sufficient rate so that the memory material is placed in a first state from a second state.

46. A method comprising:
   applying a signal to a memory material;
   setting a fall time of the signal to place the memory material in a selective state; and
   applying the signal to a second memory material having different programming characteristics than the first memory material and wherein setting a fall time of the signal includes setting a decay rate of the signal so that the memory material and the second memory material are placed in the selective state when the signal is applied to the first or second memory materials.

47. The method of claim 46, wherein the different programming characteristics include variations in resulting resistance of the first and second memory materials when a rectangular pulse having a predetermined amplitude is applied to the first and second memory materials.

48. A method comprising:
   applying a signal to a memory material;
   setting a fall time of the signal to place the memory material in a selected state; and
   setting a magnitude of the signal at a level sufficient to heat the memory material to a amorphizing temperature when the signal is applied to the memory material and wherein the fall time is set so that after the memory material reaches the amorphizing temperature, the memory material cools down at a sufficient rate so that the memory material is placed in the selected state.

49. A method comprising:
   applying a signal to a memory material;
   setting a fall time of the signal to place the material in a selective state; and
   applying a second signal to the memory material, wherein setting the fall time includes setting the fall time to be greater than a fall time of the second signal.

50. The method of claim 49 wherein a fall time of the second signal is substantially zero.

51. The method of claim 49 wherein the second signal places the memory material in a second state when the second signal is applied to the memory material.

52. The method of claim 51 wherein the selective state is a crystalline state and the second state is an amorphous state.

53. The method of claim 51 wherein a resistance of the memory material in the second state is greater than the resistance of the material in a selective state.

54. A method comprising:
   applying a signal to a memory material;
   setting a fall time of the signal to place the memory material in a selective state; and
   making the magnitude of signal sufficient to heat the memory material to an amorphizing temperature when the signal is applied to the memory material and wherein the fall time is set so that after the memory material reaches the amorphizing temperature, the memory material cools down at a sufficient rate so that the memory material is placed in a selective state.

55. A method comprising:
   applying a first signal to a plurality of cells having a memory material; and
   applying a second signal to the memory material of said cells so that all of the cells pass through the rapid crystallization temperature interval.

56. The method of claim 55 wherein the decay rate of the second signal is such that the fall time of the second signal is greater than the fall time of the first signal.

57. The method of claim 55 wherein the second signal is triangular.

58. The method of claim 57 wherein the second signal has a linear fall time.

59. The method of claim 57 wherein the second signal has a non-linear fall time.

60. The method of claim 57 wherein said second signal has a substantially linear region and a substantially non-linear region.

* * * * *